(12) United States Patent
Krishnan et al.

(10) Patent No.: US 8,451,621 B2
(45) Date of Patent: May 28, 2013

(54) SEMICONDUCTOR COMPONENT AND METHOD OF MANUFACTURE

(75) Inventors: Shutesh Krishnan, Seremban (MY); Soon Wei Wang, Negeri Sembilan (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 218 days.

(21) Appl. No.: 12/948,970

(22) Filed: Nov. 18, 2010

(65) Prior Publication Data
US 2012/0063107 A1 Mar. 15, 2012

(30) Foreign Application Priority Data
Sep. 15, 2010 (MY) .............................. PI2010004311

(51) Int. Cl.
*H05K 7/00* (2006.01)
(52) U.S. Cl.
CPC ........................................ *H05K 7/00* (2013.01)
USPC .......................................... 361/790; 361/803
(58) Field of Classification Search
CPC ................. H01L 24/73; H01L 23/3677; H01L 2224/32225; H01L 2224/33181; H01L 2224/48091; H01L 2224/73221; H01L 2224/73263
USPC . 361/790, 803, 792, 772–774; 174/259–261; 257/685, 686, 777, 778, 723, 724; 438/107, 438/113, 108
See application file for complete search history.

(56) References Cited

U.S. PATENT DOCUMENTS

| | | | |
|---|---|---|---|
| 5,291,061 A | 3/1994 | Ball | |
| 5,313,096 A | 5/1994 | Eide | |
| 5,532,512 A | 7/1996 | Fillion et al. | |
| 6,031,279 A | 2/2000 | Lenz | |
| 6,177,721 B1 | 1/2001 | Suh et al. | |
| 6,291,881 B1 | 9/2001 | Yang | |
| 6,507,098 B1 | 1/2003 | Lo et al. | |
| 6,650,006 B2 | 11/2003 | Huang et al. | |
| 6,717,251 B2 | 4/2004 | Matsuo et al. | |
| 6,720,643 B1 | 4/2004 | Fox et al. | |
| 6,774,475 B2 | 8/2004 | Blackshear et al. | |
| 6,774,476 B2 | 8/2004 | Spitz et al. | |
| 6,995,463 B1 | 2/2006 | Sutardja | |
| 7,005,734 B2 | 2/2006 | Choi et al. | |
| 7,030,317 B1 | 4/2006 | Oman | |

(Continued)

FOREIGN PATENT DOCUMENTS

| EP | 0522518 A2 | 1/1993 |
|---|---|---|
| WO | 2009070359 A1 | 6/2009 |

OTHER PUBLICATIONS

Power MOSFET, From Wikipedia, Apr. 6, 2006, 5 pages.

*Primary Examiner* — Yuriy Semenenko
(74) *Attorney, Agent, or Firm* — Rennie William Dover

(57) ABSTRACT

A semiconductor component and a method for manufacturing the semiconductor component, wherein the semiconductor component includes stacked semiconductor die. In accordance with embodiments, the semiconductor component includes a substrate having a component receiving area and a plurality of bond pads. A semiconductor chip is attached to the component receiving area. An electrical connector is coupled to the semiconductor chip and the substrate. A second semiconductor chip is mounted or attached to one of the ends of the electrical connector such that this end is positioned between the semiconductor chips. A second electrical connector is coupled between the second semiconductor chip and the substrate. A third semiconductor chip is mounted over or attached to the second electrical connector such that a portion is between the second and third semiconductor chips.

24 Claims, 10 Drawing Sheets

U.S. PATENT DOCUMENTS

| | | |
|---|---|---|
| 7,193,307 B2 | 3/2007 | Duggan |
| 7,271,477 B2 | 9/2007 | Saito et al. |
| 7,466,577 B2 * | 12/2008 | Sekiguchi et al. .............. 365/51 |
| 7,485,954 B2 | 2/2009 | Havanur |
| 7,569,920 B2 | 8/2009 | Otremba et al. |
| 7,598,600 B2 | 10/2009 | Tang et al. |
| 7,615,854 B2 | 11/2009 | Montgomery |
| 7,687,898 B2 | 3/2010 | Hung et al. |
| 7,705,434 B2 | 4/2010 | Otremba |
| 7,714,425 B2 * | 5/2010 | Yamaguchi et al. .......... 257/686 |
| 2002/0195624 A1 * | 12/2002 | Glenn et al. .................. 257/200 |
| 2005/0017339 A1 | 1/2005 | Yoshiba et al. |
| 2005/0224945 A1 * | 10/2005 | Saito et al. .................... 257/686 |

* cited by examiner

150

SEMICONDUCTOR COMPONENT AND METHOD OF MANUFACTURE

BACKGROUND

The present invention relates, in general, to electronics and, more particularly, to semiconductor die packages and methods for packaging semiconductor die.

In the past, the semiconductor industry used a variety of package configurations to increase the packing density of semiconductor die in a system. The increased demand for electronic devices increased the demand for smaller, lighter, and yet more functional semiconductor devices and resulted in a demand for semiconductor packages that had increased semiconductor packaging densities with smaller outlines and mounting footprints. In some embodiments, semiconductor die were vertically stacked on top of one another with an interposing layer of adhesive attached to the semiconductor die in order to couple the semiconductor die together. The die were attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al. on Nov. 18, 2003. Another example of an electronic assembly with stacked integrated circuit die is disclosed in U.S. Pat. No. 7,030,317, issued to Todd P. Oman on Apr. 18, 2006.

Accordingly, it would be advantageous to have a semiconductor component and method of stacking semiconductor die to manufacture the semiconductor component without increasing the footprint of the semiconductor component. It would be of further advantage for the semiconductor component and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
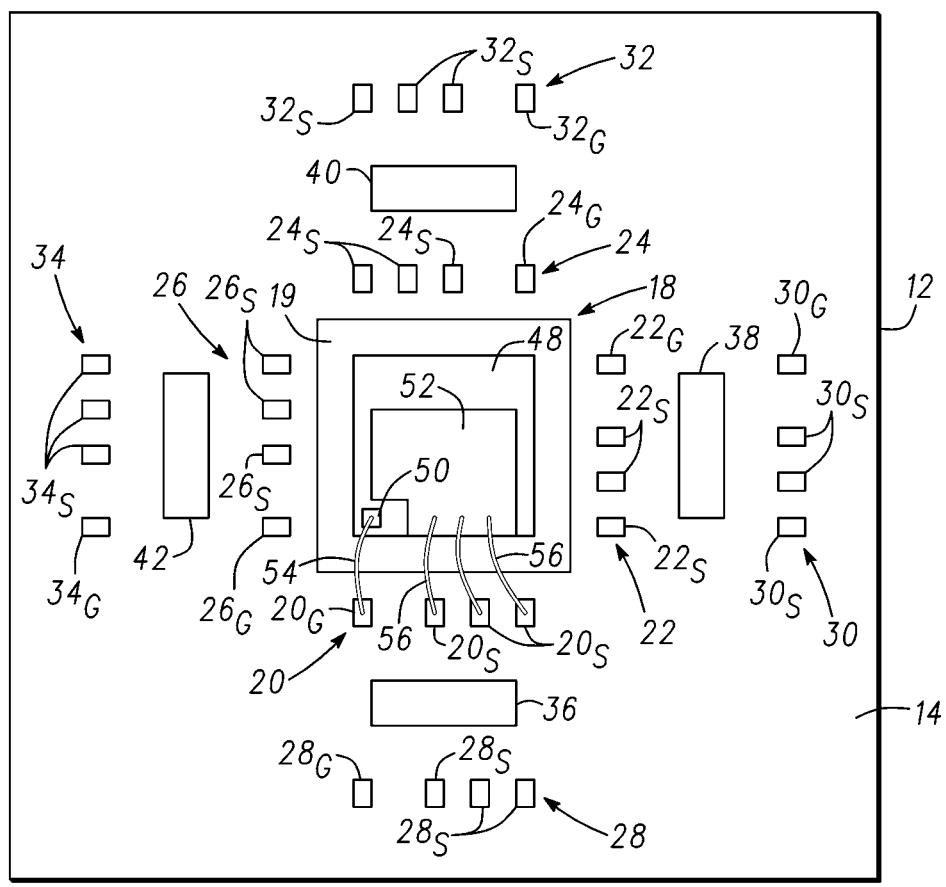
FIG. 1 is a plan view of a portion of a semiconductor component in accordance with embodiments of the present invention.

Generally, the present invention provides a semiconductor component and a method for manufacturing the semiconductor component. In accordance with embodiments of the present invention, a semiconductor component comprises a substrate having a component receiving area and a plurality of bond pads. A semiconductor chip 48 is attached to the component receiving area 18. An electrical connector 62 having ends or contact regions 64 and 68 is coupled to semiconductor chip 48 and substrate 12. A semiconductor chip 78 is mounted or attached to end 64 of electrical connector 62 such that end 64 is positioned between semiconductor chips 48 and 78. An electrical connector 92 having ends or contact regions 94 and 98 is coupled to semiconductor chip 78 and substrate 12. A semiconductor chip 118 is mounted over or attached to end 94 such that end 94 is between semiconductor chips 78 and 118.

Figure 3:
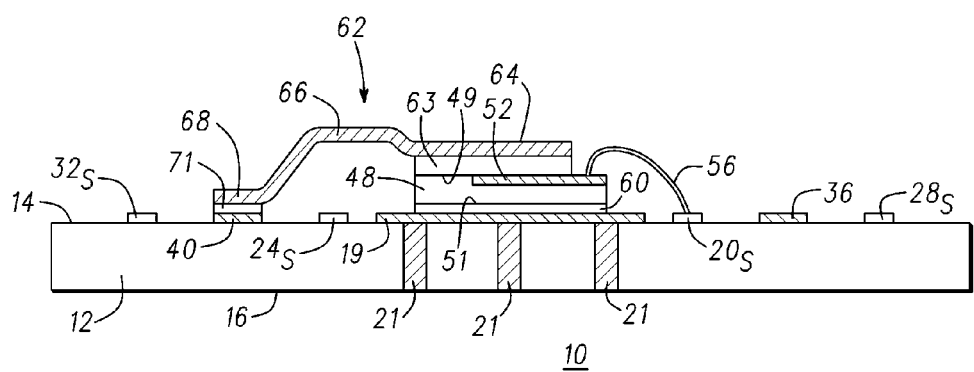
FIG. 3 is a cross-sectional view of the semiconductor component of FIG. 2 taken along section line 3-3.

FIG. 1 is a top view of a portion of a semiconductor component 10 at an early stage of manufacture in accordance with embodiments of the present invention. What is shown in FIG. 1 is a support structure 12 such as, for example, a printed circuit board having a surface 14, a component receiving area 18, a component contact structure 19 formed in a portion of component receiving area 18, sets of bond pads 20, 22, 24, and 26, sets of bond pads 28, 30, 32, and 34, and bond pads 36, 38, 40, and 42. Bond pad set 20 comprises bond pad $20_G$ and bond pads $20_S$; bond pad set 22 comprises bond pad $22_G$ and bond pads $22_S$; bond pad set 24 comprises bond pad $24_G$ and bond pads $24_S$; and bond pad set 26 comprises bond pad $26_G$ and bond pads $26_S$. Similarly, bond pad set 28 comprises bond pad $28_G$ and bond pads $28_S$; bond pad set 30 comprises bond pad $30_G$ and bond pads $30_S$; bond pad set 32 comprises bond pad $32_G$ and bond pads $32_S$; and bond pad set 34 comprises bond pad $34_G$ and bond pads $34_S$. In addition, bond pad 36 is formed between bond pad sets 20 and 28, bond pad 38 is formed between bond pad sets 22 and 30, bond pad 40 is formed between bond pad sets 24 and 32, and bond pad 42 is formed between bond pad sets 26 and 34. By way of example, bond pads $20_G$, $22_G$, $24_G$, $26_G$, $28_G$, $30_G$, $32_G$, and $34_G$ serve as bond pads for gate electrodes and may be referred to as gate bond pads or gate pads; bond pads $20_S$, $22_S$, $24_S$, $26_S$, $28_S$, $30_S$, $32_S$, and $34_S$ serve as bond pads for source electrodes and may be referred to as source bond pads or source pads; and bond pads 36, 38, 40, and 42 serve as bond pads for drain electrodes and may be referred to as drain bond pads or drain pads. It should be noted that substrate 12 has opposing major surfaces 14 and 16, where surface 16 is shown in FIG. 3.

Component contact structure 19, bond pad sets 20, 22, 24, 26, 28, 30, 32, and 34, and bond pads 36, 38, 40, and 42 may be comprised of metallization systems that include one or more layers of an electrically conductive material. Suitable metals for the metallization systems of component contact structure 19, bond pad sets 20-34, and bond pads 36-42 include copper, aluminum, alloys of aluminum, combinations thereof, or the like. Alternatively, support structure 12 can be a leadframe, a ceramic substrate, a structure comprising a resin, such as epoxy, polyimide, triazine, or a phenolic resin, an epoxy-glass composite, or the like. The layout or positioning of bond pads on support substrate 12 is not a limitation of embodiments of the present invention.

A component such as, for example, a semiconductor chip 48 having opposing surfaces 49 and 51 (shown in FIG. 3) is mounted to component contact structure 19 in component receiving area 18. Semiconductor chip 48 may be attached to component contact structure 19 using solder, an electrically conductive paste, conductive film, or the like. Surfaces 49 and 51 are on opposite sides of semiconductor chip 48. When the component coupled to component contact structure 19 is a semiconductor chip, component receiving area 18 may be referred to as a semiconductor chip receiving area or a chip receiving area. Semiconductor chip 48 has a gate bond pad 50 which serves as a gate contact and a source bond pad 52 which serves as a source contact. Gate bond pad 50 is connected to gate bond pad $20_G$ by a bond wire 54 and source bond pad 52 is connected to source bond pads $20_S$ by corresponding bond wires 56. Although a plurality of bond wires 56 is shown and three source bond pads $20_S$ are shown, the number of bond wires 56 and the number of source bond pads $20_S$ are not limitations of the present invention. There may be one, two, or more bond wires 56 and one two, three, or more bond pads $20_S$. It should be noted that the term bond wires as used throughout the application also may be referred to as wire bonds or bonding wires.

Figure 2:
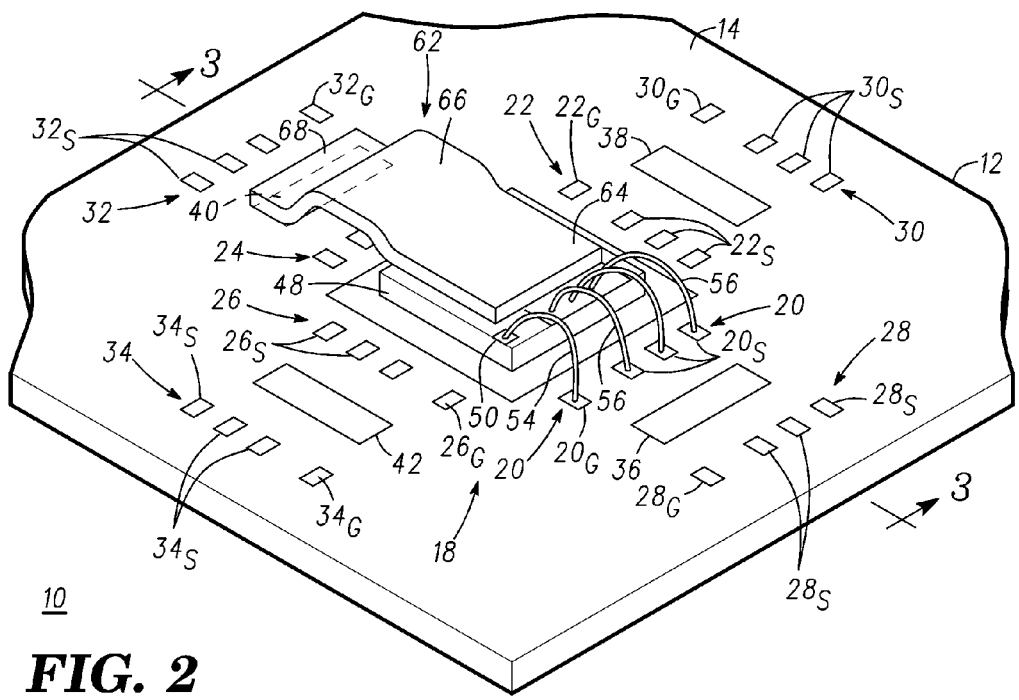
FIG. 2 is an isometric view of a portion of a semiconductor component in accordance with embodiments of the present invention.

FIG. 2 is an isometric view of a semiconductor component 10 shown in FIG. 1, but at a later stage of manufacture. FIG. 3 is a cross-sectional view of semiconductor component 10 taken along section line 3-3 of FIG. 2. For the sake of clarity, FIGS. 2 and 3 will be described together. As discussed with reference to FIG. 1, gate contact 50 is connected to bond pad $20_G$ by a bond wire 54 and source contact 52 is connected to bond pads $20_S$ by bond wires 56. An electrical connector 62 having ends 64 and 68 and a central region 66 couples source electrode 52 to bond pad 40 of support structure 12. End 64 may be referred to as an interposer region because it may be positioned between at least two semiconductor chips, i.e., a semiconductor chip may be positioned below interposer region 64 and another semiconductor chip may be positioned above interposer region 64. Electrical connecter 62 may be a clip, a wire, a ribbon, such as, for example, an aluminum ribbon, or the like. End 68 is bonded to bond pad 40 through, for example, a solder layer 71 and interposer region 64 may be connected to semiconductor chip 48 by a layer of an electrically insulating material 63. Suitable examples of dielectric material 63 include a ceramic material, thermal interface materials, thermally conductive films, an oxide layer, a silicon nitride layer, aluminum oxide, or the like. End 68 may be referred to as a contact region because it makes electrical contact with bond pad 40. By way of example, interposer region 64 is a rectangular shaped region. Suitable materials for electrical connector 62 include copper, aluminum, metals and metal alloy connectors coated with a precious metal, tin, steel, alloys of copper, beryllium, gold, silver, alloys of aluminum, brass, alloys of brass, or the like.

FIG. 3 illustrates that semiconductor chip 48 is connected to component contact structure 19 through an electrically and thermally conductive die attach material 60. Suitable die attach materials include, solder, a conductive paste, a conductive film, or the like. Surface 51 contacts die attach material 60. By way of example, semiconductor chip 48 comprises an insulated gate semiconductor device in which surface 51 serves as a drain contact. Thus, the drain contact contacts die attach material 60. Gate bond pad 50 and source bond pad 52 are formed on or from surface 49.

FIG. 3 further illustrates support structure 12 having source bond pads $20_S$, $24_S$, $28_S$, and $32_S$ and drain bond pads 36 and 40 formed on or from surface 14 and component contact structure 19 connected to heat conductors 21 that extend from component contact structure 19 to surface 16. Heat conductors 21 serve to remove heat from components mounted on or over component contact structure 19.

Figure 4:
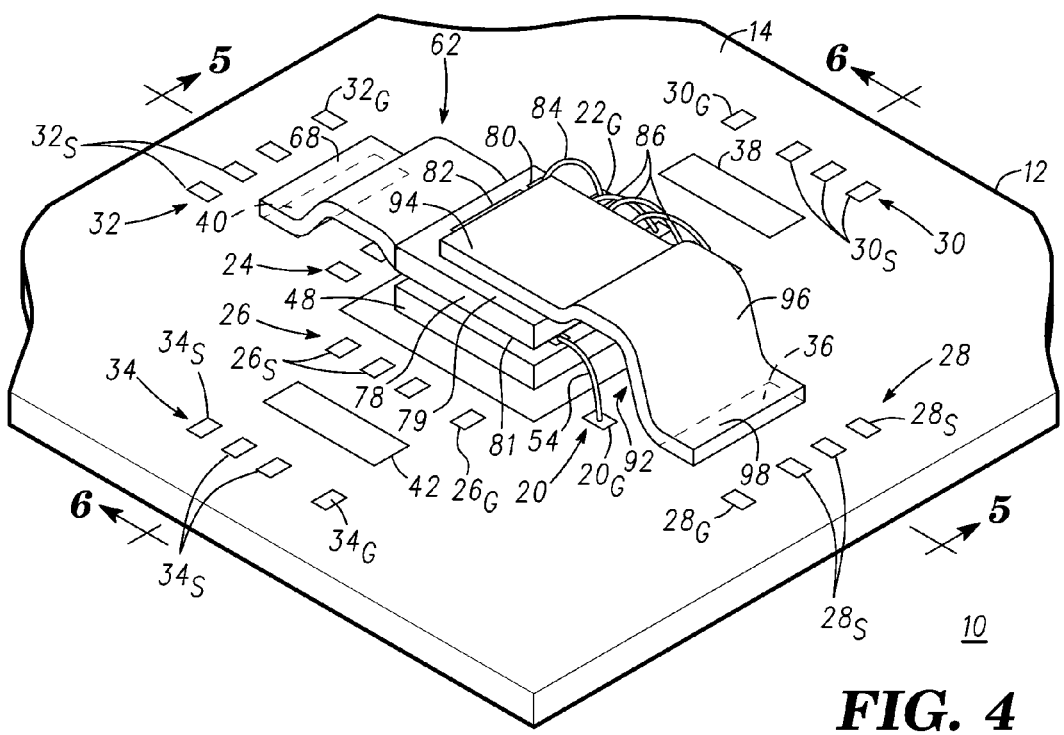
FIG. 4 is an isometric view of the semiconductor component of FIGS. 2 and 3 at a later stage of manufacture.
Figure 5:
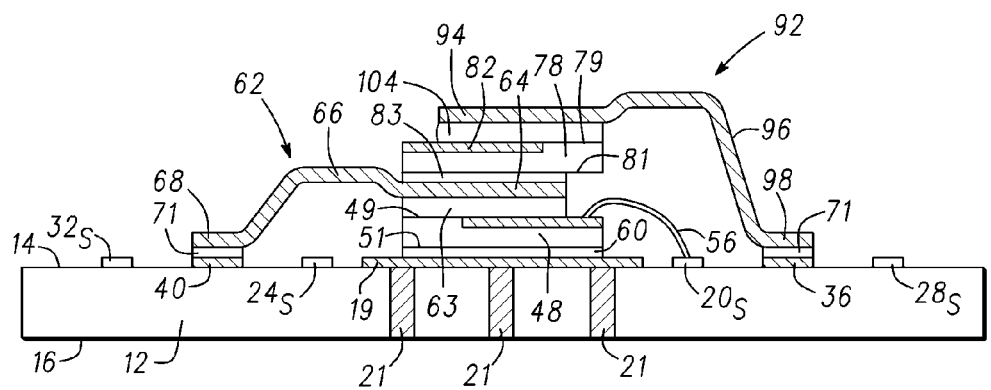
FIG. 5 is a cross-sectional view of the semiconductor component of FIG. 4 taken along section line 5-5.
Figure 6:
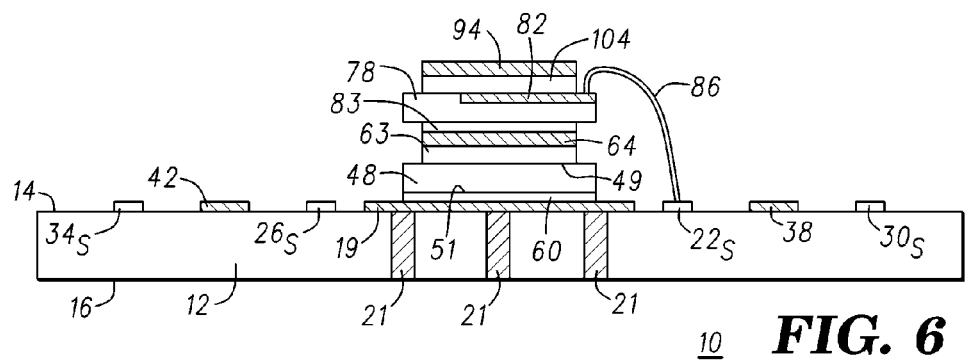
FIG. 6 is a cross-sectional view of the semiconductor component of FIG. 4 taken along section line 6-6.

FIG. 4 is an isometric view of semiconductor component 10 of FIGS. 2 and 3 at a later stage of manufacture. FIG. 5 is a cross-sectional view of semiconductor component 10 taken along section line 5-5 of FIG. 4 and FIG. 6 is a cross-sectional view of semiconductor component 10 taken along section line 6-6 of FIG. 4. For the sake of clarity, FIGS. 4-6 will be described together. What is shown in FIG. 4 is a semiconductor chip 78 having opposing surfaces 79 and 81 mounted to electrical connector 62. Semiconductor chip 78 is connected to interposer region 64 through an electrically conductive die attach material 83. Suitable die attach materials include solder, a conductive paste, a conductive film, or the like. Die attach material 83 may be the same as die attach material 60. Semiconductor chip 78 has a gate bond pad 80 which serves as a gate contact and a source bond pad 82 which serves as a source contact. Gate contact 80 is connected to gate bond pad $22_G$ by a bond wire 84 and source contact 82 is connected to source bond pads $22_S$ by corresponding bond wires 86. Although a plurality of bond wires 86 is shown and three source bond pads $22_S$ are shown, the number of bond wires 86 and the number of source bond pads $22_S$ are not limitations of the present invention. There may be one, two, or more bond wires 86 and one, two, three, or more bond pads $22_S$.

An electrical connector 92 having ends 94 and 98 and a central region 96 connects source electrode 82 to bond pad 36 of support structure 12. End 94 may be referred to as an interposer region because it may be positioned between at least two semiconductor chips, i.e., a semiconductor chip may be positioned below interposer region 94 and another semiconductor chip may be positioned above interposer region 94. Electrical connecter 92 may be a clip, a wire, a ribbon such as, for example, an aluminum ribbon, or the like. End 98 is bonded to bond pad 36 through, for example, a solder layer 71 and interposer region 94 may be connected to semiconductor chip 78 by a layer of dielectric material 104. Suitable examples of dielectric material 104 include a ceramic material, thermal interface materials, thermally conductive films, an oxide layer, a silicon nitride layer, aluminum oxide, or the like. Dielectric layer 104 may be comprised of the same material of as dielectric layer 63. End 98 may be referred to as a contact region because it makes electrical contact with bond pad 36. By way of example, interposer region 94 is a rectangular shaped region. Suitable materials for electrical connector 92 include copper, aluminum, metals and metal alloy connectors coated with a precious metal, tin, steel, alloys of copper, beryllium, gold, silver, alloys of aluminum, brass, alloys of brass, or the like.

Figure 7:
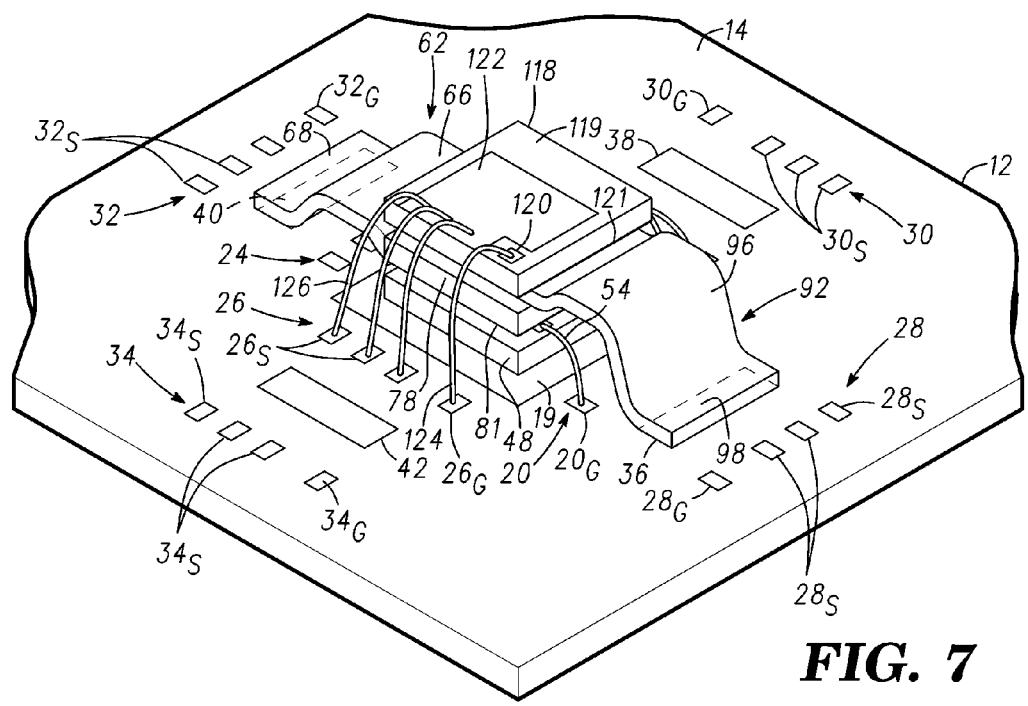
FIG. 7 is an isometric view of the semiconductor component of FIGS. 4-6 at a later stage of manufacture.

FIG. 7 is an isometric view of semiconductor component 10 at a later stage of manufacture. What is shown in FIG. 7 is a semiconductor chip 118 having opposing surfaces 119 and 121 mounted to electrical connector 92. It should be noted that semiconductor chip 118 may be attached to interposer region 94 of electrical connector 92 through a dielectric material such as, for example, the material of dielectric layers 63 and 104. Semiconductor chip 118 has a gate bond pad 120 which serves as a gate contact and a source bond pad 122 which serves as a source contact. Gate bond pad 120 is connected to gate bond pad $26_G$ by a bond wire 124 and source bond pad 122 is connected to source bond pads $26_S$ by corresponding bond wires 126. Although a plurality of bond wires 126 is shown and three source bond pads $26_S$ are shown, the number of bond wires 126 and the number of source bond pads $26_S$ are not limitations of the present invention. There may be one, two, or more bond wires 126 and one, two, three, or more bond pads $26_S$.

Figure 8:
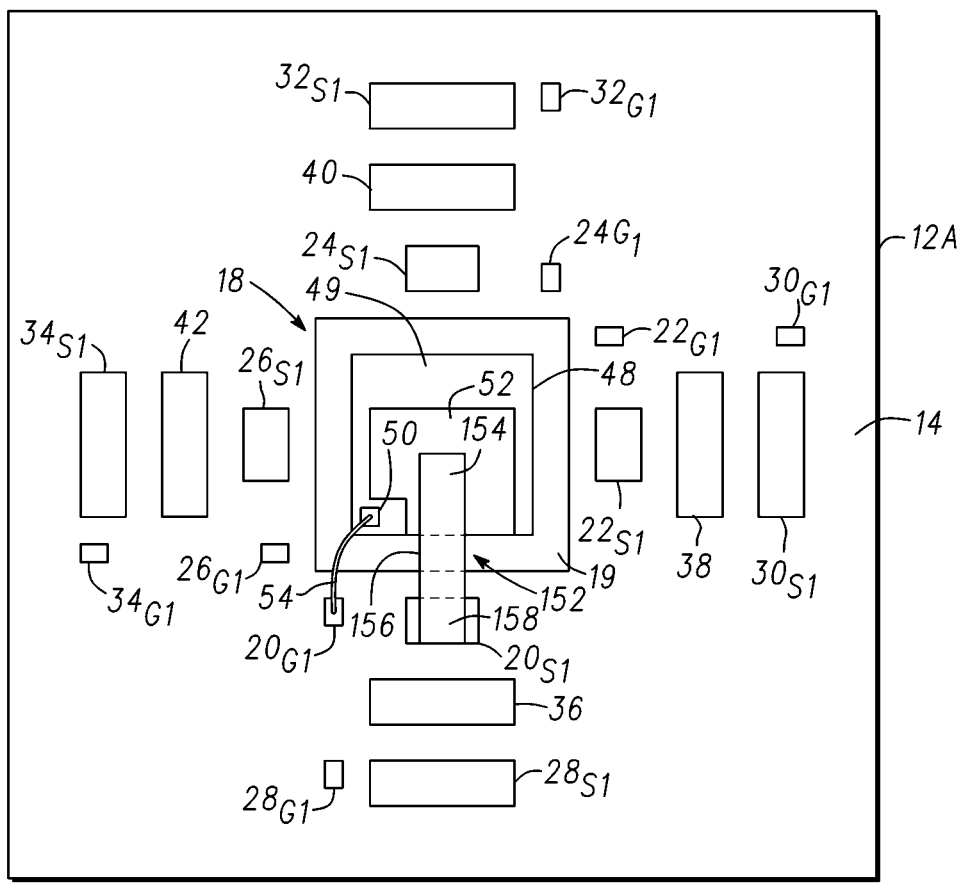
FIG. 8 is a plan view of a portion of a semiconductor component in accordance with embodiments of the present invention.

FIG. 8 is a top view of a portion of a semiconductor component 150 at an early stage of manufacture in accordance with another embodiment of the present invention. What is shown in FIG. 8 is a support structure 12A such as, for example, a printed circuit board having a surface 14, a component receiving area 18, a component contact structure 19 formed in a portion of component receiving area 18, bond pads $20_{G1}$, $20_{S1}$, $22_{G1}$, $22_{S1}$, $24_{G1}$, $24_{S1}$, $26_{G1}$, $26_{S1}$, $28_{G1}$, $28_{S1}$, $30_{G1}$, $30_{S1}$, $32_{G1}$, $32_{S1}$, and $34_{G1}$, $34_{S1}$, and bond pads 36, 38, 40, and 42. It should be noted that substrate 12A is similar to substrate 12 except that sets of bond pads $20_S$, $22_S$, $24_S$, $26_S$, $28_S$, $30_S$, $32_S$, and $34_S$ have been replaced by bond pads $20_{S1}$, $22_{S1}$, $24_{S1}$, $26_{S1}$, $28_{S1}$, $30_{S1}$, $32_{S1}$, and $34_{S1}$, respectively. For the sake of consistency, reference characters $20_G$, $22_G$, $24_G$, $26_G$, $28_G$, $30_G$, $32_G$, and $34_G$ shown in FIG. 1 have been replaced by reference characters $20_{G1}$, $22_{G1}$, $24_{G1}$, $26_{G1}$, $28_{G1}$, $30_{G1}$, $32_{G1}$, and $34_{G1}$, respectively.

Like semiconductor component 10 shown in FIGS. 1-3, a component such as, for example, a semiconductor chip 48 having opposing surfaces 49 and 51 (shown in FIG. 3) is mounted to component contact structure 19 in component receiving area 18. When the component connected to component contact structure 19 is a semiconductor chip, component receiving area 18 may be referred to as a semiconductor chip receiving area or a chip receiving area. Semiconductor chip 48 has a gate contact 50 and a source contact 52. Gate contact 50 is connected to gate bond pad $20_{G1}$ by a bond wire 54 and source contact 52 is connected to source bond pads $20_{S1}$ by an electrical connector 152. By way of example, electrical connector 152 has contact ends 154 and 158 and a central portion 156. Electrical connector 152 may be made of the same materials as electrical connectors 62 and 92. Contact end 154 may be connected to source contact 52 through an electrically conductive material such as, for example solder. Contact end 158 may be connected to bond pad $20_{S1}$ through an electrically conductive material such as, for example, solder.

Figure 9:
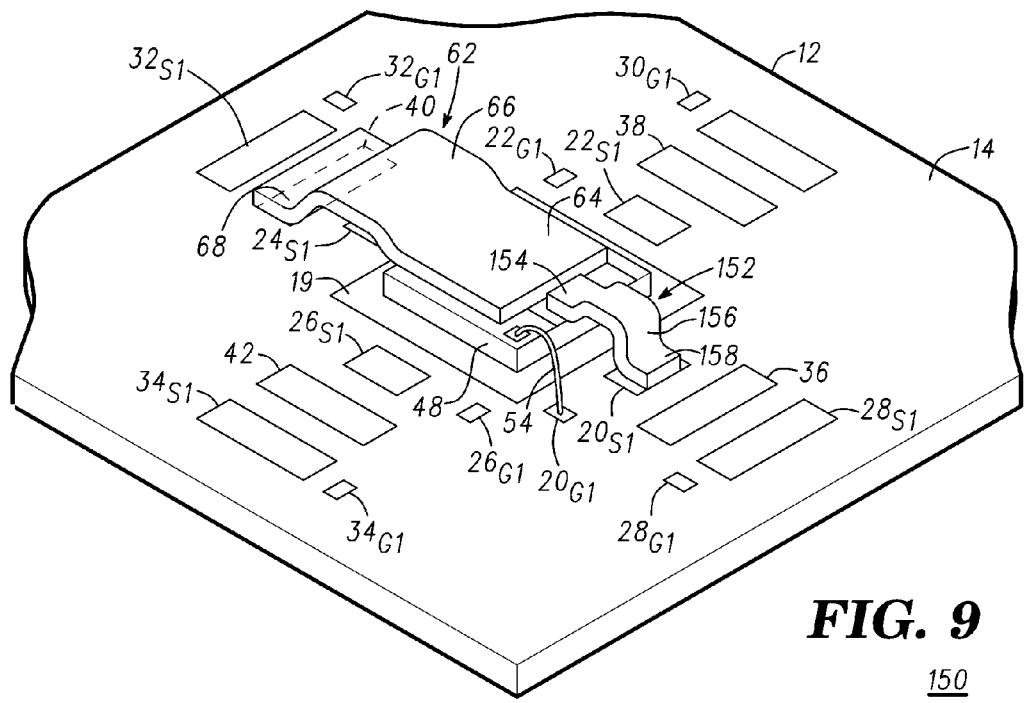
FIG. 9 is an isometric view of the semiconductor component of FIG. 8 at a later stage of manufacture.

FIG. 9 is an isometric view of semiconductor component 150 shown in FIG. 8, but at a later stage of manufacture. FIG. 9 is similar to FIG. 2 except that bond wires 56 have been replaced by electrical connector 152 having contact ends 154 and 158. As described above, contact end 154 is electrically connected to source contact 52 via an electrically conductive material such as, for example, solder and contact end 158 is electrically connected to bond pad $20S_1$ through an electrically conductive material such as, for example, solder. Bond wires and electrical connectors may be referred to as interconnects or electrical interconnects.

Figure 10:
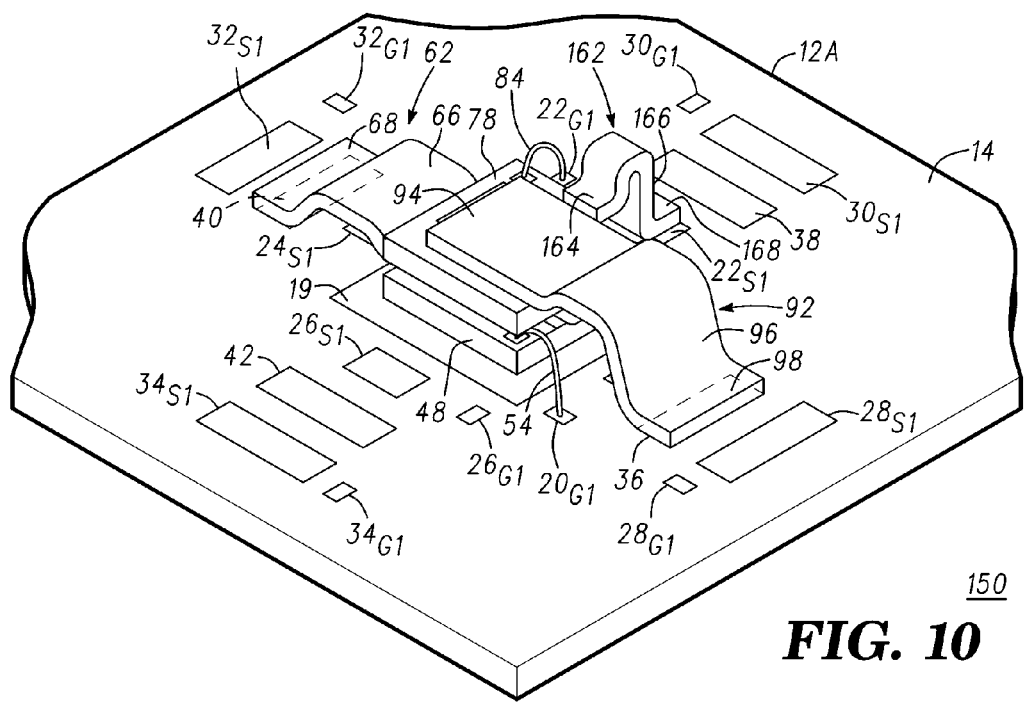
FIG. 10 is an isometric view of the semiconductor component of FIG. 9 at a later stage of manufacture.

FIG. 10 is an isometric view of semiconductor component 150 shown in FIG. 9, but at a later stage of manufacture. FIG. 10 is similar to FIG. 4 except that bond wires 56 and 86 have been replaced by electrical connectors 152 and 162, respectively. Electrical connector 152 has been described with reference to FIG. 8. By way of example, electrical connector 162 has contact ends 164 and 168 and a central portion 166. Contact end 164 may be connected to source contact 82 (shown in FIG. 5) through an electrically conductive material such as, for example solder. Contact end 168 may be connected to bond pad $22_{S1}$ through an electrically conductive material such as, for example, solder. Bond wires and electrical connectors may be referred to as interconnects or electrical interconnects.

Figure 11:
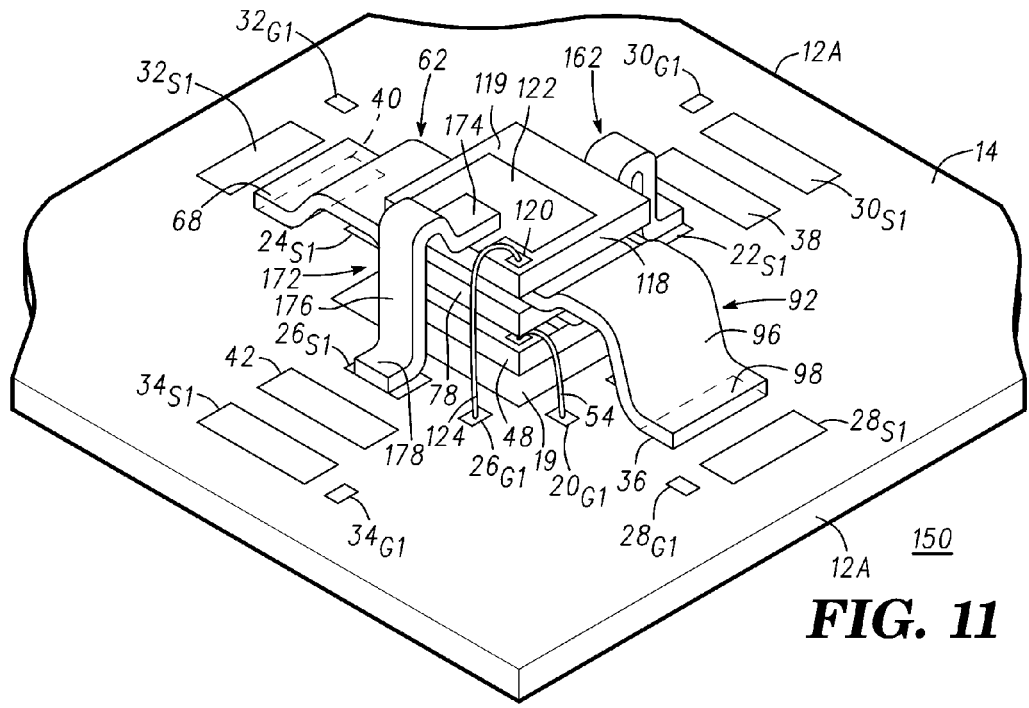
FIG. 11 is an isometric view of the semiconductor component of FIG. 10 at a later stage of manufacture.

FIG. 11 is an isometric view of semiconductor component 150 shown in FIG. 10, but at a later stage of manufacture. FIG. 11 is similar to FIG. 7 except that bond wires 126 have been replaced by electrical connector 172, which has contact ends 174 and 178 and a central region 176 that is between contact ends 174 and 178. Contact end 178 is electrically connected to bond pad $26S_1$ and contact end 174 is connected to source contact 122. Bond wires and electrical connectors may be referred to as interconnects or electrical interconnects.

Figure 12:
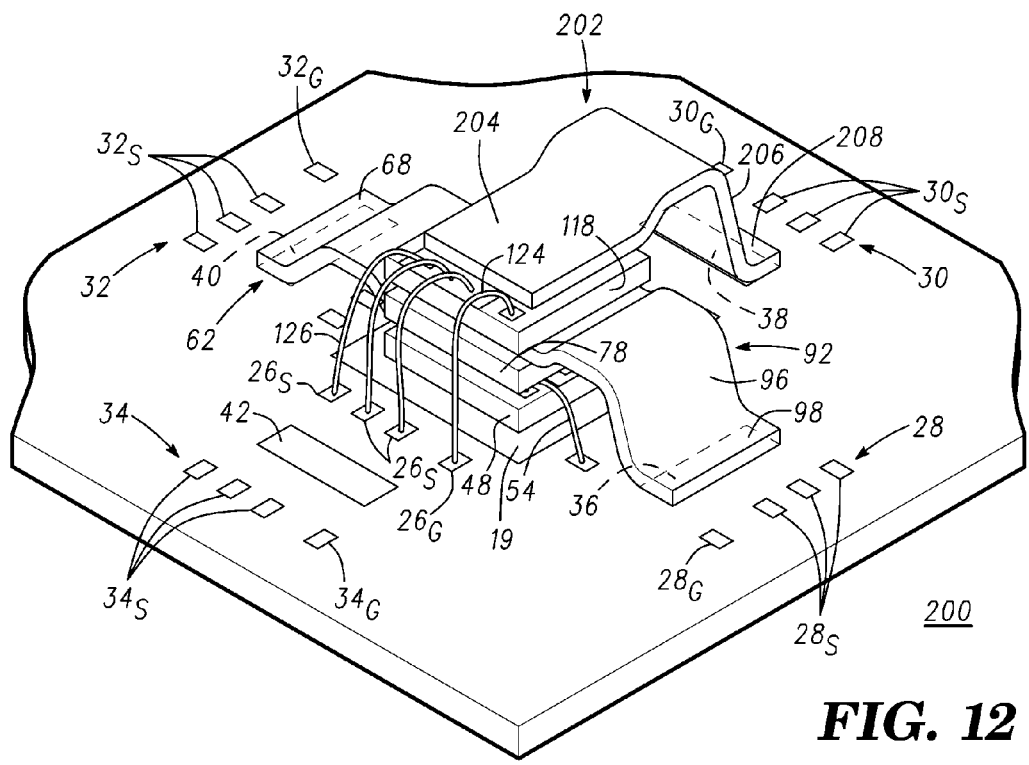
FIG. 12 is an isometric view of the semiconductor component of FIG. 11 at a later stage of manufacture.

FIG. 12 is an isometric view of a semiconductor component 200 in accordance with another embodiment of the present invention. The description of FIG. 12 continues from the description of FIG. 7. It should be noted that the semiconductor component of FIGS. 1-7 has been identified by reference character 10. For the sake of clarity, the reference number for the description of the semiconductor component of FIG. 12 has been changed to reference character 200. What is shown in FIG. 12 is an electrical connector 202 connecting source contact 122 to bond pad 38. Electrical connector 202 has ends 204 and 208 and a central region 206. End 204 may be referred to as an interposer region because it may be positioned between at least two semiconductor chips, i.e., a semiconductor chip may be positioned below interposer region 204 and another semiconductor chip may be positioned above interposer region 204. Electrical connecter 202 may be a clip, a wire, a ribbon such as, for example, an aluminum ribbon, or the like. End 208 is bonded to bond pad 206 through, for example, a solder layer and interposer region 204 may be connected to semiconductor chip 118 by a layer of dielectric material such as, for example, dielectric layer 63 or dielectric layer 104 (shown in FIG. 6). By way of example, interposer region 204 is a rectangular shaped region. Suitable materials for electrical connector 202 include copper, aluminum, metals and metal alloy connectors coated with a precious metal, tin, steel, alloys of copper, beryllium, gold, silver, alloys of aluminum, brass, alloys of brass, or the like.

Figure 13:
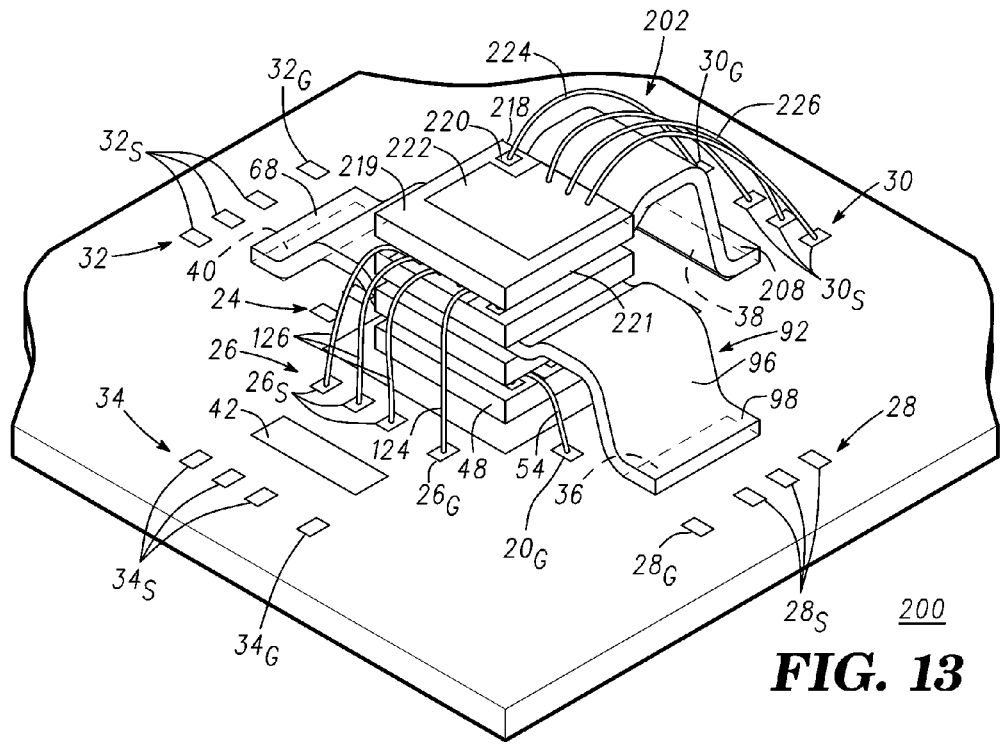
FIG. 13 is an isometric view of the semiconductor component of FIG. 12 at a later stage of manufacture.

FIG. 13 is an isometric view of semiconductor component 200 of FIG. 12 but at a later stage of manufacture. What is shown in FIG. 13 is a semiconductor chip 218 having opposing surfaces 219 and 221 mounted to electrical connector 202. Semiconductor chip 218 has a gate bond pad 220 which serves as a gate contact and a source bond pad 222 which serves as a source contact. Gate bond pad 220 is connected to gate bond pad $30_G$ by a bond wire 224 and source bond pad 222 is connected to source bond pads $30_S$ by corresponding bond wires 226. Bond wires may be referred to as wire bonds or bonding wires. Although a plurality of bond wires 226 is shown and three source bond pads $30_S$ are shown, the number of bond wires 226 and the number of source bond pads $30_S$ are not limitations of the present invention. There may be one, two, or more bond wires 226 and one two, three, or more bond pads $30_S$.

Figure 14:
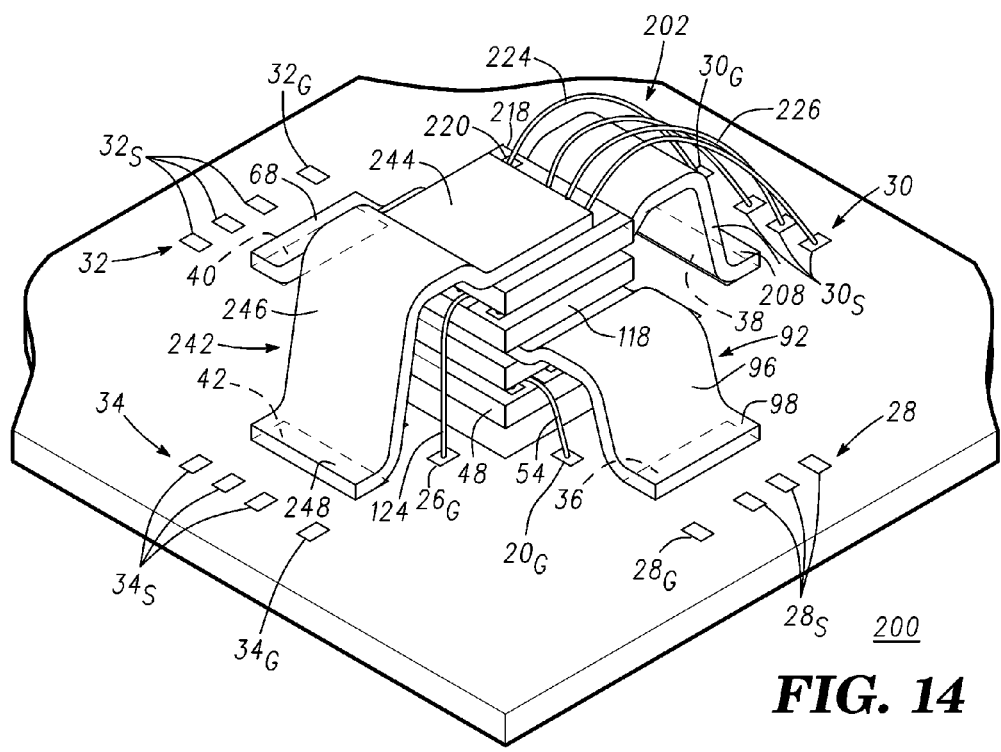
FIG. 14 is an isometric view of the semiconductor component of FIG. 13 at a later stage of manufacture.

FIG. 14 is an isometric view of semiconductor component 200 of FIG. 13 but at a later stage of manufacture. What is shown in FIG. 14 is an electrical connector 242 connecting source contact 222 to bond pad 42. Electrical connector 242 has ends 244 and 248 and a central region 246. End 244 may be referred to as an interposer region because it may be positioned between at least two semiconductor chips, i.e., a semiconductor chip may be positioned below interposer region 244 and another semiconductor chip may be positioned above interposer region 244. Electrical connecter 242 may be a clip, a wire, a ribbon such as, for example, an aluminum ribbon, or the like. End 248 is bonded to bond pad 42 through, for example, a solder layer and interposer region 244 is connected to semiconductor chip 218 through a layer of dielectric material such as, for example, dielectric layer 63 or dielectric layer 104 (shown in FIG. 6). By way of example, interposer region 244 is a rectangular shaped region. Suitable materials for electrical connector 242 include copper, aluminum, metals and metal alloy connectors coated with a precious metal, tin, steel, alloys of copper, beryllium, gold, silver, alloys of aluminum, brass, alloys of brass, or the like.

Figure 15:
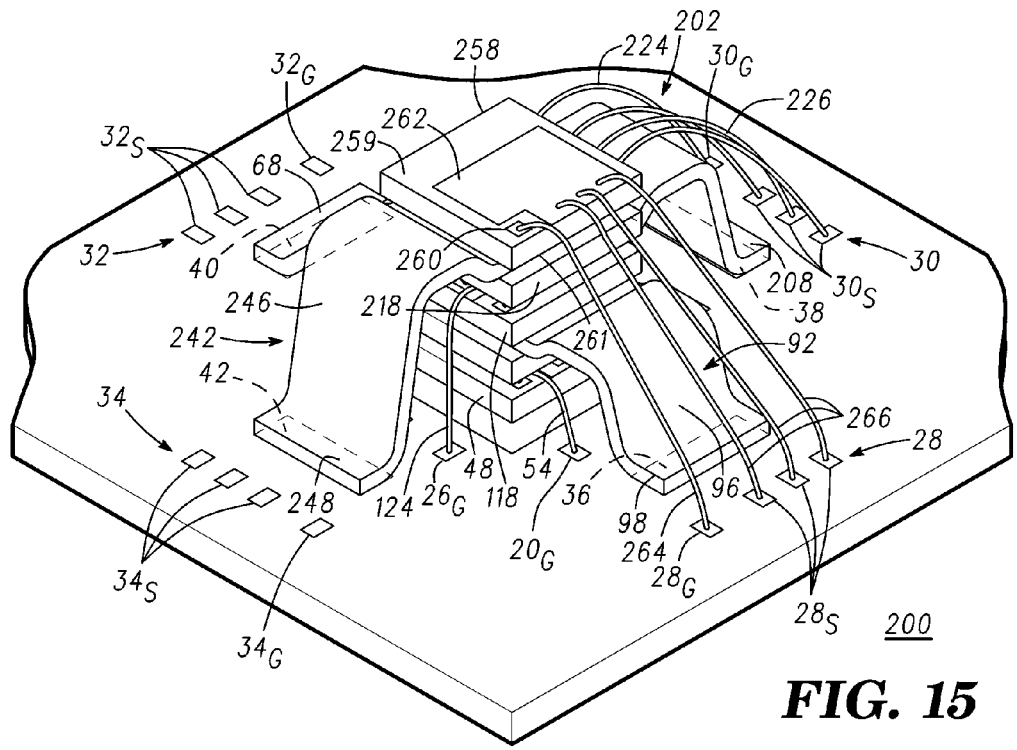
FIG. 15 is an isometric view of the semiconductor component of FIG. 14 at a later stage of manufacture.

FIG. 15 is an isometric view of semiconductor component 200 of FIG. 14 but at a later stage of manufacture. What is shown in FIG. 15 is a semiconductor chip 258 having surfaces 259 and 261 mounted to electrical connector 242. Semiconductor chip 258 has a gate bond pad 260 which serves as a gate contact and a source bond pad 262 which serves as a source contact. Gate bond pad 260 is connected to gate bond pad $28_G$ by a bond wire 264 and source bond pad 262 is connected to source bond pads $28_S$ by corresponding bond wires 266. Bond wires may be referred to as wire bonds or bonding wires. Although a plurality of bond wires 266 is shown and three source bond pads $28_S$ are shown, the number of bond wires 266 and the number of source bond pads $28_S$ are not limitations of the present invention. There may be one, two, or more bond wires 266 and one, two, three, or more bond pads $28_S$.

Typically, a protective structure (not shown) is formed around semiconductor chips 48, 78, 118, 218, and 258, electrical connectors 62, 92, 202, and 242, and bond wires 54, 56, 84, 86, 124, 126, 224, 226, 264 and 266. By way of example, the protective structure is a mold compound. It should be noted that the type of protective structure is not a limitation of the present invention. For example, the protective structure may be a lid or cap, or the like. Alternatively, the protective structure may be absent.

Figure 16:
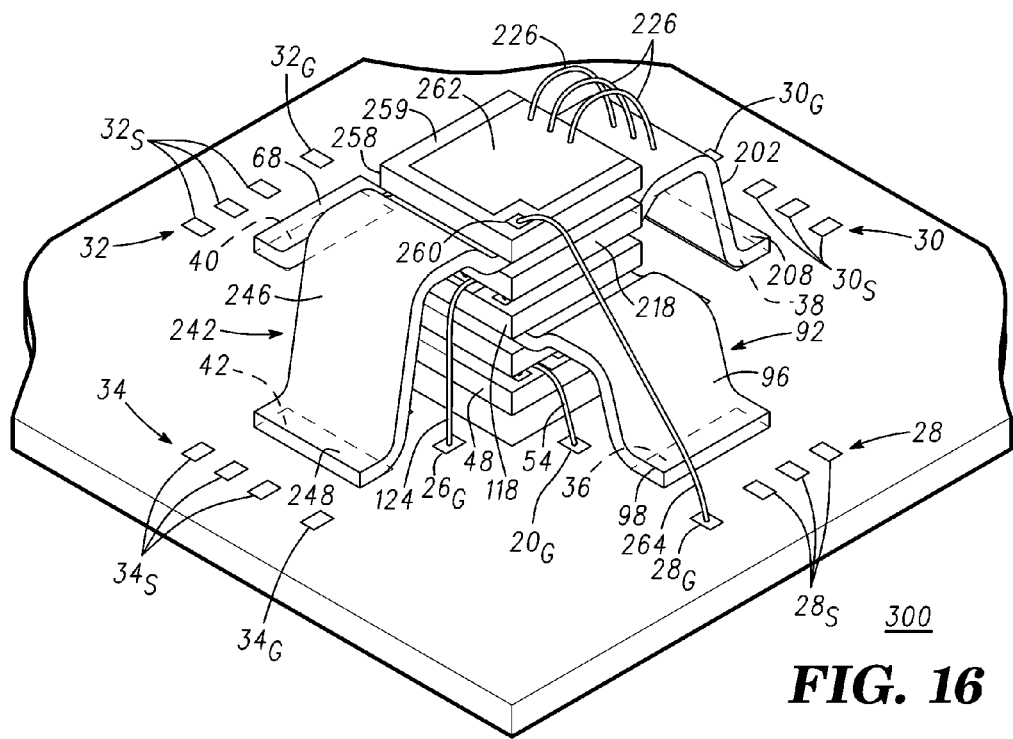
FIG. 16 is an isometric view of a semiconductor component in accordance with embodiments of the present invention.

FIG. 16 is an isometric view of a semiconductor component 300 in accordance with another embodiment of the present invention. Semiconductor component 300 is similar to semiconductor component 200, except that bond wires 226 are connected to electrical conductor 202 rather than to bond pad 38.

Figure 17:
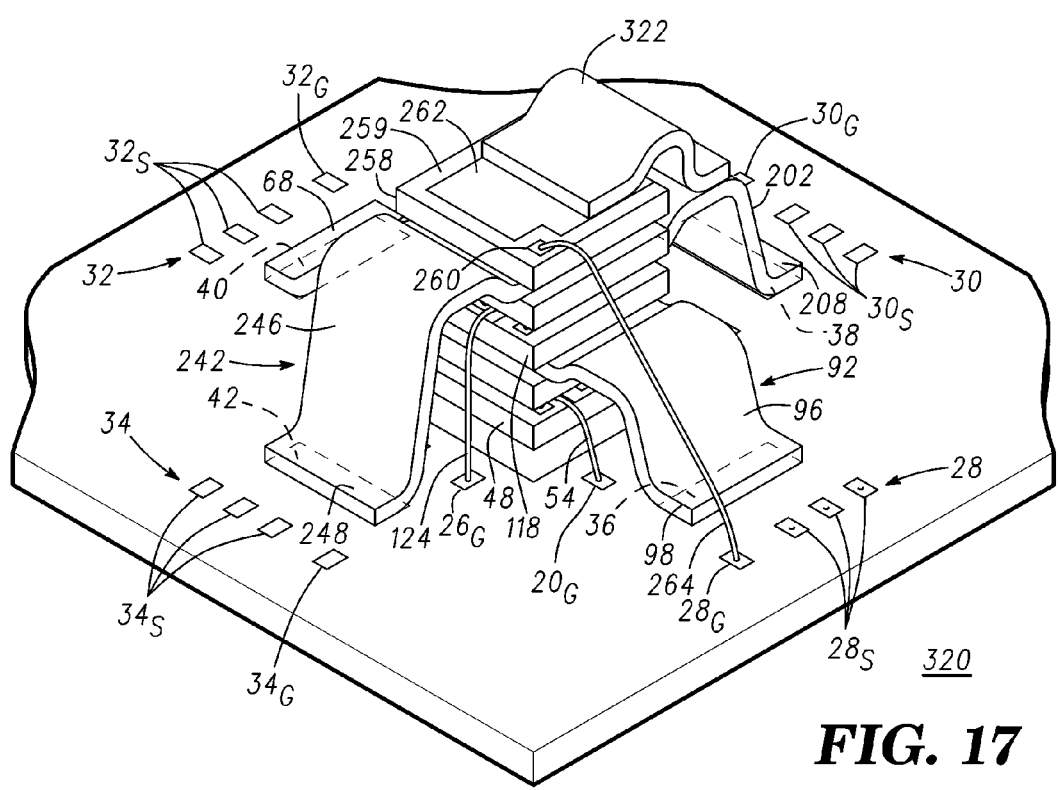
FIG. 17 is an isometric view of a semiconductor component in accordance with embodiments of the present invention.

FIG. 17 is an isometric view of a semiconductor component 320 in accordance with another embodiment of the present invention. Semiconductor component 320 is similar to semiconductor component 300, except that source region 262 is connected to electrical conductor 202 through an electrical conductor or clip 322 instead of bond wires.

By now it should be appreciated that a semiconductor component and a method for manufacturing the semiconductor component have been provided. In accordance with embodiments of the present invention, semiconductor die having, for example, power Metal Oxide Semiconductor Field Effect Transistors (MOSFETs) are formed in a stacked configuration. Thus, a plurality of stacked semiconductor die are packaged in a protective material such as, for example, a mold compound. An advantage of manufacturing semiconductor components in accordance with embodiments of the present invention is that it allows stacking three or more semiconductor die, which decreases the footprint of the packaged semiconductor die. In addition, the semiconductor die can function as individual devices or may cooperate to form, for example, complementary components as shown in FIGS. 16 and 17. In addition, embodiments in accordance with the present invention enhance the power capability of the semiconductor component using a package with a smaller footprint.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor component, comprising:
   a substrate having a component receiving area and a plurality of bond pads;
   a first semiconductor chip having first and second surfaces, the first surface of the first semiconductor chip electrically coupled to the component receiving area;
   a first dielectric material over a portion of the second surface of the first semiconductor chip;
   a first electrical connector having first and second ends, the first end over the first dielectric material and adjacent to the second surface of the first semiconductor chip;
   a second semiconductor chip having first and second surfaces, the first surface of the second semiconductor chip electrically coupled to the first end of the first electrical connector, wherein the first end of the first electrical conductor is positioned between the first and second semiconductor chips;
   a second dielectric material over a portion of the second surface of the second semiconductor chip;
   a second electrical connector having first and second ends, the first end of the second electrical connector over the second dielectric material and adjacent to the second surface of the second semiconductor chip; and
   a third semiconductor chip having first and second surfaces, the first surface of the third semiconductor chip electrically coupled to the first end of the second electrical connector, wherein the first end of the second electrical connector is between the second and third semiconductor chips,
   wherein the first surface of the first semiconductor chip includes a portion of a drain, and further including a gate bond pad at a first portion of the second surface of the first semiconductor chip and a source bond pad at a second portion of the second surface of the first semiconductor chip.

2. The semiconductor component of claim 1, wherein the plurality of bond pads on the substrate comprises first and second bond pads, and further including a third electrical connector coupled between the gate bond pad of the first semiconductor chip and the first bond pad on the substrate and a fourth electrical connector coupled between the source bond pad of the first semiconductor chip and the second bond pad on the substrate.

3. The semiconductor component of claim 2, wherein the first surface of the second semiconductor chip includes a portion of a drain, and further including a gate bond pad at a first portion of the second surface of the second semiconductor chip and a source bond pad at a second portion of the second surface of the second semiconductor chip.

4. The semiconductor component of claim 3, wherein the plurality of bond pads on the substrate comprises third and fourth bond pads, and further including a fifth electrical connector coupled between the gate bond pad at the first portion of the second semiconductor chip and the third bond pad on the substrate and a sixth electrical connector coupled between the source bond pad of the second semiconductor chip and the fourth bond pad on the substrate.

5. The semiconductor component of claim 4, wherein the first surface of the third semiconductor chip includes a portion of a drain, and further including a gate bond pad at a first portion of the second surface of the second semiconductor chip and a source bond pad at a second portion of the second surface of the second semiconductor chip.

6. The semiconductor component of claim 5, wherein the plurality of bond pads on the substrate comprises fifth and sixth bond pads, and further including a seventh electrical connector coupled between the gate bond pad at the first portion of the third semiconductor chip and the fifth bond pad on the substrate and an eighth electrical connector coupled between the source bond pad of the third semiconductor chip and the sixth bond pad on the substrate.

7. The semiconductor component of claim 6, wherein the first and second electrical connectors are clips and the third, fourth, fifth, sixth, seventh, and eighth electrical connectors are bond wires.

8. The semiconductor component of claim 6, wherein the first, second, fourth, sixth, and eighth electrical connectors are clips and the third, fifth, and seventh electrical connectors are bond wires.

9. The semiconductor component of claim 7, further including a ninth electrical connector having first and second ends, the first end of the ninth electrical connector adjacent to the second surface of the third semiconductor chip.

10. The semiconductor component of claim 9, further including a fourth semiconductor chip having first and second surfaces, the first surface of the fourth semiconductor chip coupled to the first end of the ninth electrical connector, wherein the first end of the ninth electrical connector is between the third and fourth semiconductor chips.

11. The semiconductor component of claim 10, wherein the first surface of the fourth semiconductor chip includes a portion of a drain, and further including a gate bond pad at a first portion of the second surface of the fourth semiconductor chip and a source bond pad at a second portion of the second surface of the fourth semiconductor chip.

12. The semiconductor component of claim 11, wherein the plurality of bond pads on the substrate comprises seventh and eighth bond pads, and further including a tenth electrical connector coupled between the gate bond pad of the fourth semiconductor chip and the seventh bond pad on the substrate and an eleventh electrical connector coupled between the source bond pad of the fourth semiconductor chip and the eighth bond pad on the substrate.

13. The semiconductor component of claim 7, further including a twelfth electrical connector having first and second ends, the first end of the twelfth electrical connector adjacent to the second surface of the fourth semiconductor chip.

14. The semiconductor component of claim 13, further including a fifth semiconductor chip having first and second surfaces, the first surface of the fifth semiconductor chip coupled to the first end of the twelfth electrical connector, wherein the first end of the twelfth electrical connector is between the fourth and fifth semiconductor chips.

15. The semiconductor component of claim 13, wherein the plurality of bond pads on the substrate comprises ninth and tenth bond pads, and wherein the first surface of the fifth semiconductor chip includes a portion of a drain, and further including a gate bond pad at a first portion of the second surface of the fifth semiconductor chip and a source bond pad at a second portion of the second surface of the fifth semiconductor chip, and further including a thirteenth electrical connector coupled between the gate bond pad of the fifth semiconductor chip and the ninth bond pad on the substrate and a fourteenth electrical connector coupled between the source bond pad of the fifth semiconductor chip and the tenth bond pad on the substrate.

16. The semiconductor component of claim 13, wherein the first surface of the fifth semiconductor chip includes a portion of a drain, and further including a gate bond pad at a first portion of the second surface of the fifth semiconductor chip and a source bond pad at a second portion of the second surface of the fifth semiconductor chip, and further including a thirteenth electrical connector coupled between the gate bond pad of the fifth semiconductor chip and the ninth bond pad on the substrate and a fourteenth electrical connector coupled between the source bond pad of the fifth semiconductor chip and the ninth electrical interconnect.

17. The semiconductor component of claim 16, wherein the ninth electrical interconnect is one of a clip or a bond wire.

18. A semiconductor component, comprising:
a substrate having a chip receiving area and a plurality of bond pads;
a first semiconductor chip electrically coupled to the chip receiving area, the first semiconductor chip having first and second surfaces, wherein the second surface includes a gate contact and a source contact;
a first dielectric material over a portion of the second surface of the first semiconductor chip;
a first electrical connector coupled between the portion of the second surface of the first semiconductor chip and a first bond pad of the plurality of bond pads, the first electrical connector above the first dielectric material;
a second semiconductor chip electrically coupled to the first electrical connector, the second semiconductor chip having first and second surfaces, wherein the second surface of the second semiconductor chip includes a gate contact and a source contact;
a second dielectric material over a portion of the second surface of the second semiconductor chip;
a second electrical connector having first and second portions, the first portion of the second electrical connector over the portion of the second dielectric material and the second portion coupled to a second bond pad of the plurality of bond pads; and
a third semiconductor chip having first and second surfaces, the first surface of the third semiconductor chip electrically coupled to the second electrical connector, wherein the portion of the second electrical connector is between the second and third semiconductor chips.

19. The semiconductor component of claim 18, furthering including a third electrical connector coupled between the gate contact of the first semiconductor chip and a third bond pad of the plurality bond pads and the a fourth electrical connector coupled between the source contact of the first semiconductor chip and a fourth bond pad of the plurality of bond pads.

20. The semiconductor component of claim 19, further including a fifth electrical connector coupled between the gate contact of the second semiconductor chip and a fifth bond pad of the plurality bond pads and the a sixth electrical connector coupled between the source contact of the second semiconductor chip and a sixth bond pad of the plurality of bond pads.

21. The semiconductor component of claim 20, further including a seventh electrical connector coupled between the gate contact of the third semiconductor chip and a seventh bond pad of the plurality bond pads and an eighth electrical connector coupled between the source contact of the third semiconductor chip and eighth bond pad of the plurality of bond pads.

22. The semiconductor component of claim 21, wherein the first, second, sixth, and eighth electrical connectors are clips.

23. The semiconductor component of claim 22, wherein the first and second electrical connectors are on opposite sides of the second semiconductor chip and the sixth and eighth electrical connectors are on opposite sides of the third semiconductor chip.

24. The semiconductor component of claim 21, wherein the first and second electrical connectors are clips and at least the third, fifth, and seventh electrical connectors are bond wires.

* * * * *